(12) United States Patent
Kim et al.

(10) Patent No.: US 8,012,288 B2
(45) Date of Patent: Sep. 6, 2011

(54) METHOD OF FABRICATING FLEXIBLE DISPLAY DEVICE

(75) Inventors: Myung-Hwan Kim, Yongin-si (KR); Woo-Jae Lee, Yongin-si (KR); Hyung-Il Jeon, Incheon (KR); Myeong-Hee Kim, Mungyeong-si (KR)

(73) Assignee: Samsung Electronics Co., Ltd. (KR)

( * ) Notice: Subject to any disclaimer, the term of this patent is extended or adjusted under 35 U.S.C. 154(b) by 399 days.

(21) Appl. No.: 12/190,487

(22) Filed: Aug. 12, 2008

(65) Prior Publication Data

US 2009/0047859 A1 Feb. 19, 2009

(30) Foreign Application Priority Data

Aug. 13, 2007 (KR) ........................ 10-2007-0081412

(51) Int. Cl.
*B44C 1/17* (2006.01)
*B29C 65/16* (2006.01)
*B29C 65/54* (2006.01)
*B32B 37/00* (2006.01)
*B32B 38/10* (2006.01)

(52) U.S. Cl. ..... 156/235; 156/239; 156/247; 156/272.8; 156/289; 430/256; 430/259; 438/455

(58) Field of Classification Search .................. 156/230, 156/235, 239, 241, 247, 272.2, 272.8, 273.5, 156/289, 308.2; 430/11, 14, 17, 18, 201, 430/256, 259; 438/48–98, 128, 381, 455
See application file for complete search history.

(56) References Cited

U.S. PATENT DOCUMENTS

| 6,350,386 | B1 * | 2/2002 | Lin ................................ 216/13 |
| 6,683,416 | B1 * | 1/2004 | Oohata et al. .............. 315/169.3 |
| 2005/0087289 | A1 * | 4/2005 | Toyoda ........................ 156/230 |
| 2005/0106839 | A1 * | 5/2005 | Shimoda et al. ............. 438/458 |

FOREIGN PATENT DOCUMENTS

| JP | 2006-203220 | 8/2006 |
| JP | 2007-004205 | 1/2007 |
| KR | 2006-0134934 | 12/2006 |

OTHER PUBLICATIONS

English Abstract, Publication No. JP-2006-203220.
English Abstract, Publication No. JP-2007-004205.
English Abstract, Publication No. KR-2006-0134934.

* cited by examiner

*Primary Examiner* — Philip Tucker
*Assistant Examiner* — Sing Chan
(74) *Attorney, Agent, or Firm* — Innovation Counsel LLP

(57) ABSTRACT

A method of fabricating a flexible display device, the method including applying an adhesive layer including polyimide on a carrier substrate, laminating a flexible substrate on the adhesive layer, and separating the carrier substrate from the flexible substrate by irradiating a laser beam or light onto the adhesive layer.

21 Claims, 9 Drawing Sheets

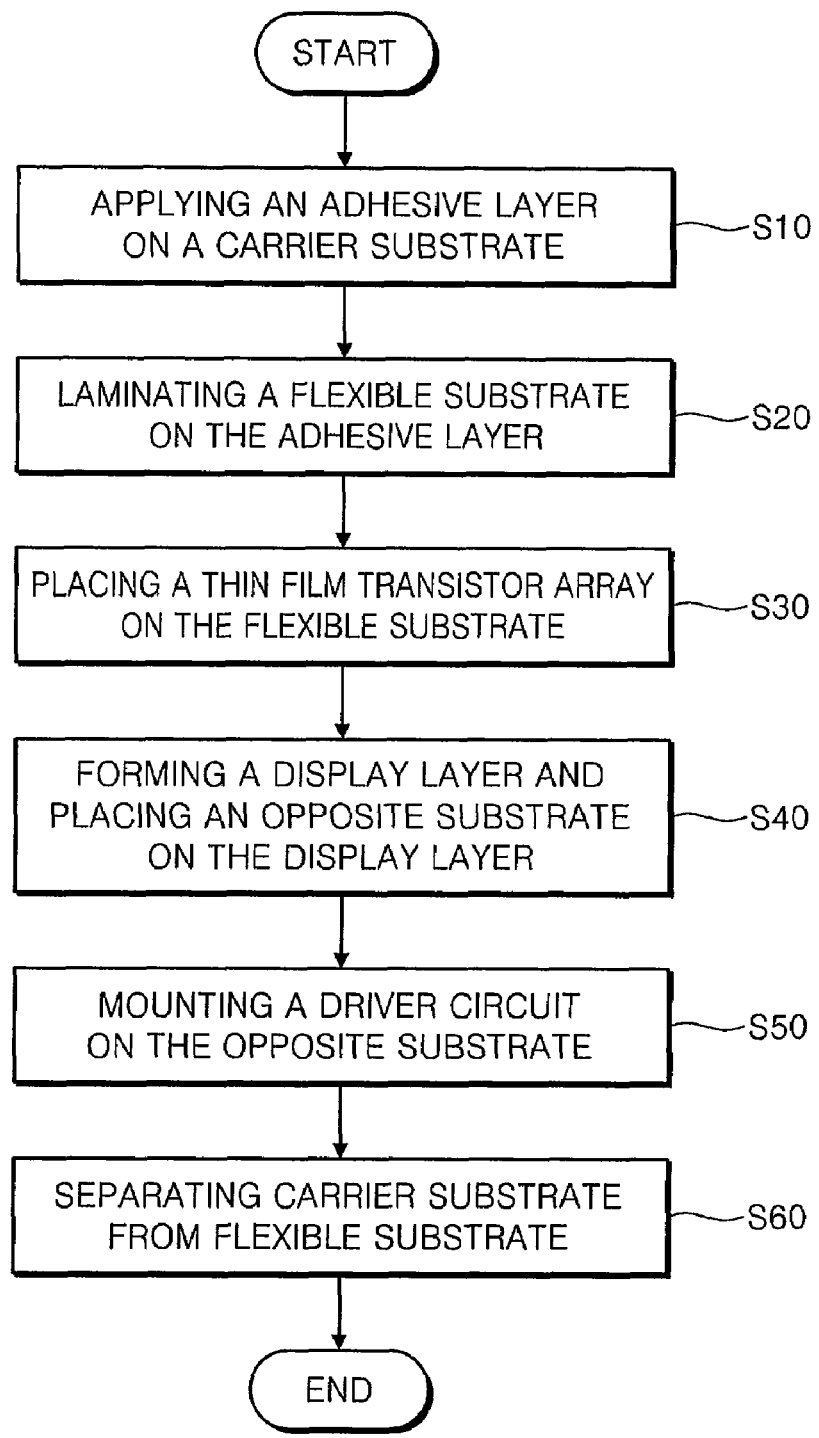

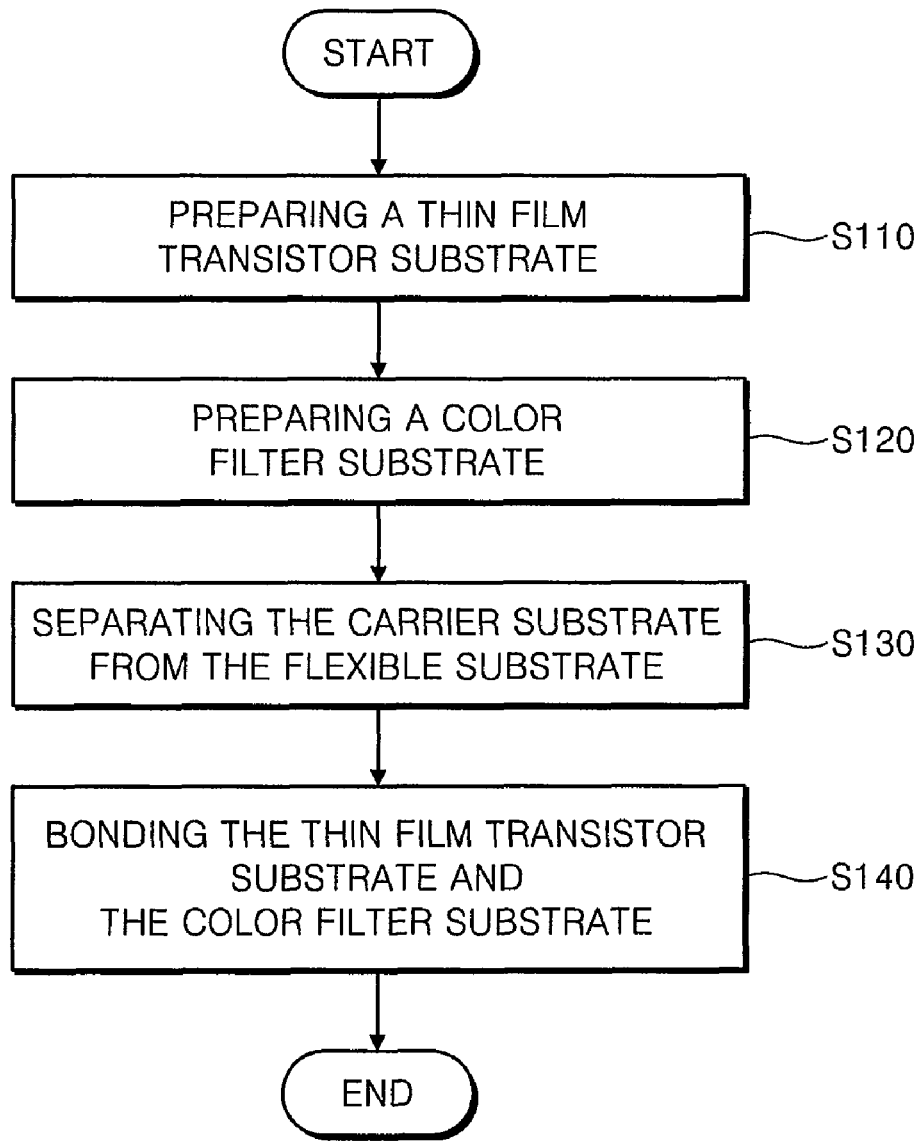

METHOD OF FABRICATING FLEXIBLE DISPLAY DEVICE

CROSS-REFERENCE TO RELATED APPLICATION

This application claims priority under 35 U.S.C. §119 to Korean Patent Application No. 10-2007-0081412, filed on Aug. 13, 2007 in the Korean Intellectual Property Office (KIPO), the contents of which are incorporated herein by reference in their entirety.

BACKGROUND OF THE INVENTION

1. Field of the Invention

The disclosure relates to display devices, and more particularly, to a method of fabricating a flexible display device.

2. Description of the Related Art

Display devices have recently been comprised of flat panel display devices capable of achieving large area, lightness and slimness. Flat panel display devices include liquid crystal displays ("LCDs"), plasma display panels ("PDPs"), organic light emitting displays ("OLEDs"), and the like. The LCDs, PDPs, and OLEDs use a glass substrate so that its flexibility may be decreased.

Recently, flexible display devices using a flexible substrate such as plastic or foil instead of a glass substrate have actively been developed as future display devices.

A process of fabricating and handling a thin film transistor ("TFT") on a plastic substrate ("TOP") is a core process in fabricating a flexible display panel. However, fabricating a TOP panel by directly using the plastic substrate in an existing panel fabrication process on the glass substrate still has problems in terms of processing due to the flexibility of the substrate and the flexibility of the display device.

Accordingly, an approach for using the existing panel fabrication process and the existing equipment includes laminating a plastic substrate on a carrier substrate such as a glass substrate by using an adhesive material, directly fabricating a TFT array on the plastic substrate, and detaching the carrier substrate from the plastic substrate.

However, it is difficult to develop an adhesive material that can withstand a high temperature process and that can also easily delaminate the carrier substrate from the plastic substrate after the fabrication of the TFT array.

SUMMARY OF THE INVENTION

An aspect of the invention provides a fabricating method of a flexible display device that can withstand a high temperature process, and that can also easily separate a carrier substrate from a plastic substrate in the final process after fabricating elements such as a TFT.

According to an aspect of the invention, there is provided a method of fabricating a flexible display device including applying an adhesive layer including polyimide on a carrier substrate, placing a flexible substrate on the adhesive layer, and separating the carrier substrate from the flexible substrate by irradiating a laser beam or light onto the adhesive layer.

The method of fabricating the flexible display device further includes forming a TFT array on the flexible substrate after placing the flexible substrate on the adhesive layer, forming a display layer on the flexible substrate on which the TFT array is formed, placing an opposite substrate on the display layer, and mounting a driving circuit on the display layer to drive the display layer.

The method of fabricating the flexible display device further includes forming a color filter array on the flexible substrate after placing the flexible substrate on the adhesive layer, placing a display layer on the flexible substrate on which the color filter array is formed, and placing an opposite substrate on the display layer.

The adhesive layer is comprised of a mixture of the polyimide and a coupler.

The adhesive layer includes a polyimide layer including the polyimide, and coupler layers which include a coupler and are formed at upper and lower surfaces of the polyimide layer.

The method of fabricating the flexible display device further includes heating the adhesive layer to a first temperature for a first amount of time after placing the adhesive layer on the surface of the carrier substrate, and heating the adhesive layer to a second temperature higher than the first temperature for a second amount of time after placing the flexible substrate on the adhesive layer.

A surface of the flexible substrate is processed by plasma or oxygen.

The flexible substrate is comprised of a polymer material selected from a group consisting of Kapton, polyether sulphone, polyethylene naphthelate, fiber reinforced plastic, and polyacrylate.

Separating the carrier substrate from the flexible substrate is implemented by irradiating an excimer laser beam onto the adhesive layer.

The polyimide has a glass transition temperature of 350° C. or greater.

According to another aspect of the invention there is provided a fabricating method of a flexible display device including placing an adhesive layer made of an adhesive hardening agent having a glass transition temperature of 350° C. or greater on a carrier substrate, placing a flexible substrate on the adhesive layer, and separating the carrier substrate from the flexible substrate by irradiating a laser beam or light onto the adhesive layer.

The adhesive layer is comprised of polyimide.

The adhesive layer is comprised of a mixture of the polyimide and a coupler.

The adhesive layer includes a polyimide layer including polyimide, and coupler layers which include a coupler and are formed at upper and lower surfaces of the polyimide layer.

BRIEF DESCRIPTION OF THE DRAWINGS

The above and other features and advantages of the invention will be more clearly understood from the following detailed description taken in conjunction with the accompanying drawings, in which:

FIG. 1 is a flow chart showing a process of fabricating an electrophoretic display device as a flexible display device in accordance with a first exemplary embodiment of the present invention;

FIG. 3 is a flow chart showing a process of fabricating a color electrophoretic display device as a flexible display device in accordance with a second exemplary embodiment of the present invention;

DETAILED DESCRIPTION OF THE EXEMPLARY EMBODIMENTS

Hereinafter, exemplary embodiments are described in detail with reference to FIGS. 1 to 5.

FIG. 1 is a flow chart showing a process of fabricating an electrophoretic display device as a flexible display device in accordance with a first exemplary embodiment of the present invention. FIGS. 2A, 2B, 2C, 2D, 2E, 2F, and 2G are cross-sectional views showing a process of fabricating an electrophoretic display device as a flexible display device in accordance with the first exemplary embodiment of the present invention.

Referring to FIG. 1, a fabricating method of a flexible display device includes applying an adhesive layer on a carrier substrate (step S10), placing a flexible substrate on the carrier substrate (step S20), forming a TFT array on the flexible substrate (step S30), forming a display layer and placing an opposite substrate on the display layer (step S40), mounting a driving circuit on the opposite substrate (step S50), and separating the carrier substrate from the flexible substrate (step S60). Hereinafter, a fabricating method of an electrophoretic display device in accordance with the first exemplary embodiment of the present invention is described in detail with reference to FIGS. 2A to 2G.

Figure 2A:
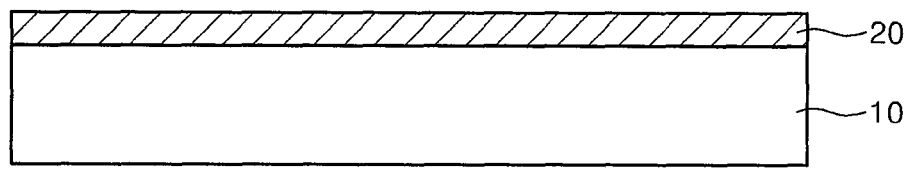
FIGS. 2A, 2B, 2C, 2D, 2E, 2F, and 2G are cross-sectional views showing a process of fabricating an electrophoretic display device as a flexible display device in accordance with a first exemplary embodiment of the present invention.

Referring to FIG. 2A, an adhesive layer 20 is formed on a carrier substrate 10. The carrier substrate 10 may be formed of an insulating material such as glass. The adhesive layer 20 may include a thermostable adhesive hardening agent having a glass transition temperature more than 350° C.

For example, the adhesive layer 20 may comprise polyimide, or a mixture of the polyimide and a coupler. The adhesive layer 20 may be applied to the carrier substrate 10 by a printing method, a slit coating method, a spin coating method, a dipping method, or the like. The polyimide used for the adhesive layer 20 may be transparent or opaque. Transparent polyimide may be used as a color filter substrate during manufacturing of a color electrophoretic display device, and opaque polyimide may be used as a TFT substrate during manufacturing of an electrophoretic display device for black and white as well as for a color electrophoretic display. Opaque polyimide may not be a good choice for a color filter substrate, because the color of the opaque polyimide is deep yellow or amber. On the other hand, the transparent polyimide may be used for both the TFT substrate and the color filter substrate.

Presently, PIX1400, a product provided by HD Microsystems the address of which is 250 Cheesequake Rd., Parlin, N.J., USA, is being used as a polyimide for an adhesive layer. The PIX series does not need an additional primer or coupler, because a high molecular chain of the PIX series includes an ingredient which can be bonded to glass. The polyimide has the superior property of having a heat-resisting temperature of 350° C. or more.

Meanwhile, the polyimide of the Kapton products from DuPont the address of which is Route 23 South and Dupont Road, Circleville, Ohio, USA, which do not include an adhesive material, has a coefficient of thermal expansion ("CTE") of 20 or less, a heat-resisting temperature of 350° C. or more, and flexibility. Accordingly, when the reliability of a TFT substrate is secured, the polyimide can be used as a substrate of a flexible display device without using an additional carrier substrate.

Next, a solvent contained in the adhesive layer 20 is removed by a soft baking process. The soft baking process may be implemented by heating the adhesive layer 20 at 90° C. for 60 seconds.

Figure 2B:
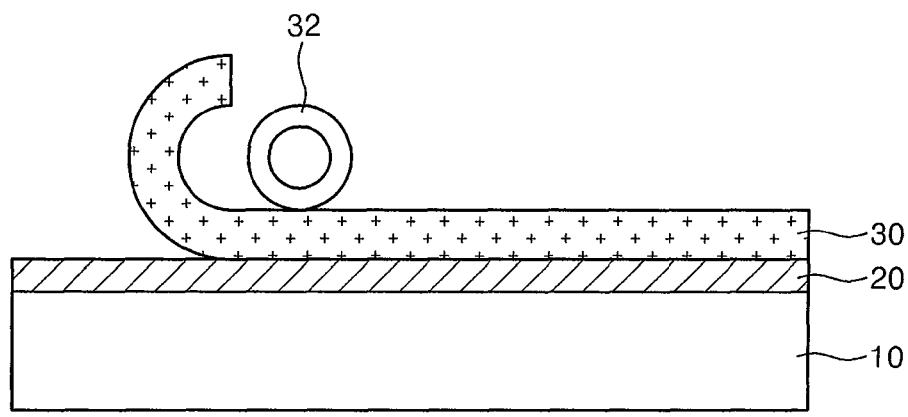
Figure 2C:
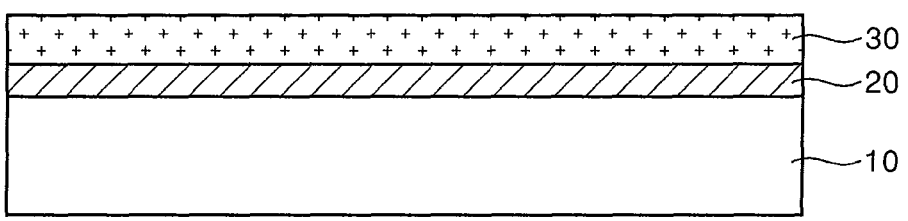
Figure 5:
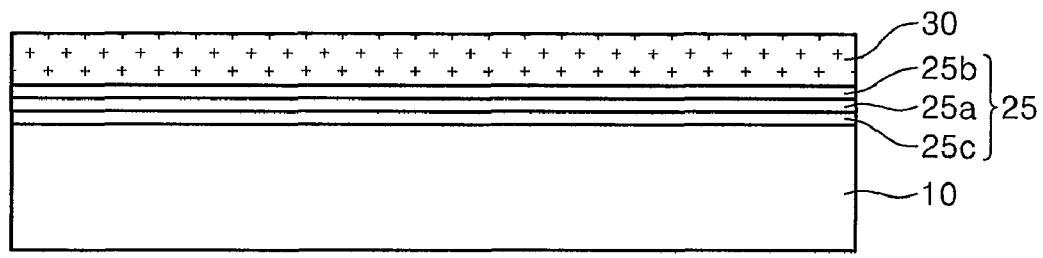
FIG. 5 is a cross-sectional view showing an alternative adhesive layer for use in the process illustrated in FIG. 2C.

When a coupler is not included in the adhesive layer 20 of FIG. 2C, coupler layers may be further formed as shown in FIG. 5. More specifically, an adhesive layer 25 may include a polyimide layer 25a and coupler layers 25b and 25c. The coupler layers 25b and 25c are formed at upper and lower surfaces of the polyimide layer 25a, respectively. A thickness of an adhesive layer 25 may be about 80 nm to about 200 nm.

Referring to FIG. 2B, a flexible substrate 30 is applied to the adhesive layer 20. The flexible substrate 30 may be applied by a lamination method using a roller 32. The flexible substrate 30 is formed of a polymer material selected from a group consisting of Kapton, polyether sulphone ("PES"), polyethylene naphthelate ("PEN"), fiber reinforced plastic ("FRP"), and polyacrylate ("PAR").

As illustrated in FIG. 2C, flexible substrate 30 is bonded to the carrier substrate 10 by the adhesive layer 20. The adhesive layer 20 is hardened by a hard baking process to have the property value and the adhesive strength required for a TFT array process. The hard baking process may be implemented by heating the adhesive layer 20 at 350° C. for an hour. The adhesive strength between the flexible substrate 30 and the adhesive layer 20 can be improved by reforming the surface of the flexible substrate 30 by oxygen plasma or ultraviolet rays to obtain similar properties as the surface of the carrier substrate 10. In other words, the adhesive strength between the flexible substrate 30 and the adhesive layer 20 is increased by changing the properties of the surface of the flexible substrate 30 by the oxygen plasma or ultraviolet rays.

The flexible substrate 30 includes a TFT array formed by well-known processes. The TFT array includes a gate line, a data line, a TFT formed at an intersection of the gate line and the data line, and a first electrode electrically connected to the TFT.

The TFT supplies a data voltage supplied from the data line to the first electrode in response to a scan signal supplied from the gate line. The TFT includes a gate electrode, a source electrode, a drain electrode, an active layer, and an ohmic contacting layer.

The first electrode generates a potential difference with a second electrode formed in the opposite substrate (60, refer to FIG. 2D to FIG. 2G) by charging a voltage according to the data voltage supplied from the TFT. A display layer 40 between the flexible substrate 30 and the opposite substrate 60 is driven by the potential difference to display an image.

Figure 2D:
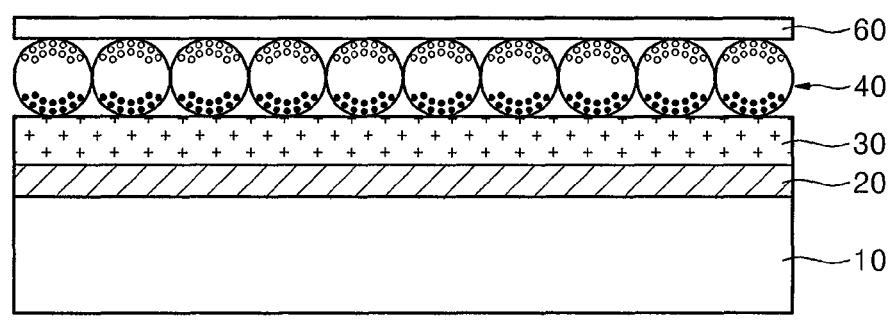

Referring to FIG. 2D, the display layer 40 and the opposite layer 60 are placed on the flexible substrate 30.

The display layer 40 may include an electrophoretic film. The electrophoretic film includes microcapsules formed of a transparent thin film, and black and white charged particles charged with positive polarity and negative polarity within the microcapsules. The white and black charged particles within the microcapsules are moved toward electrodes of opposite polarity when an electric field is formed within the microcapsules by the potential difference between the first electrode and the second electrode. The color-charged particles within the microcapsules reflect an incident light from the outside to display images of white and black.

The opposite substrate 60 which includes the second electrode protects the microcapsules from an external shock, and is formed of a transparent material so that a user can view images displayed by the color-charged particles. For example, the opposite substrate 60 may be formed in a film type such as plastic or glass.

The second electrode is placed on the electrophoretic film to face the first electrode. The second electrode is formed of a transparent material like the opposite substrate 60. For example, the second electrode may be formed of indium tin oxide ("ITO") or indium zinc oxide ("IZO"). The second electrode forms the electric field together with the first electrode to control the black charged particles and white charged particles of the microcapsules.

Figure 2E:
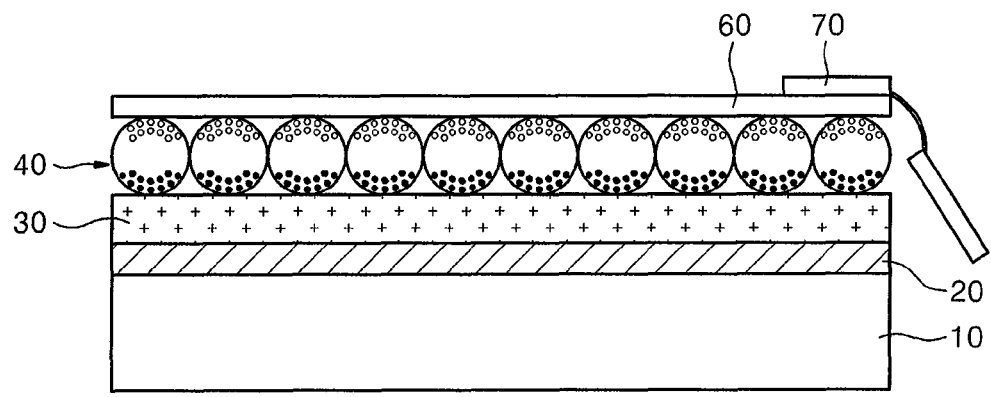

Referring to FIG. 2E, a driving circuit 70 is mounted on the opposite substrate 60. The driving circuit 70 generates signals to drive the gate line and the data line. More specially, the driving circuit 70 generates signals to drive the TFT by externally supplied driving voltages and control signals. The driving circuit 70 supplies the generated signals to the gate line and the data line. The driving circuit 70 may be mounted by an outer lead bonding ("OLB") method.

Figure 2F:
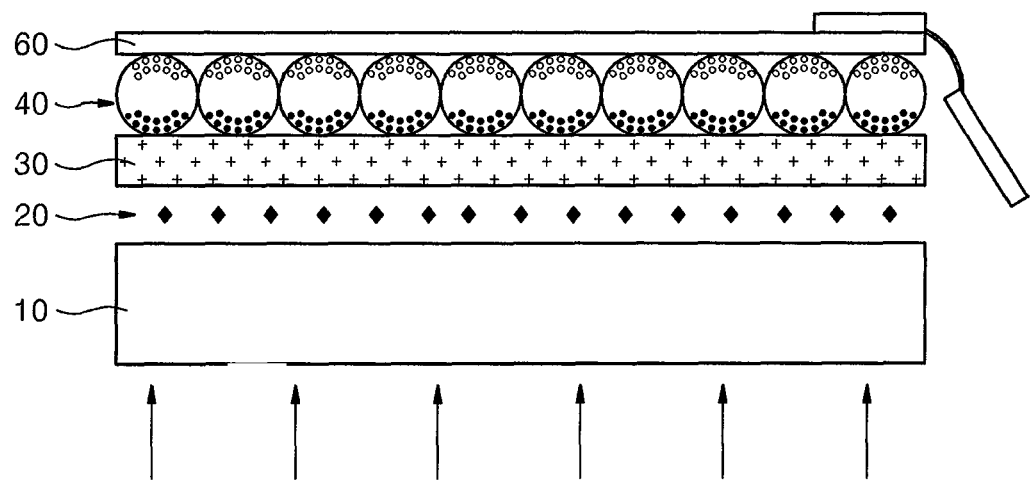
Figure 2G:
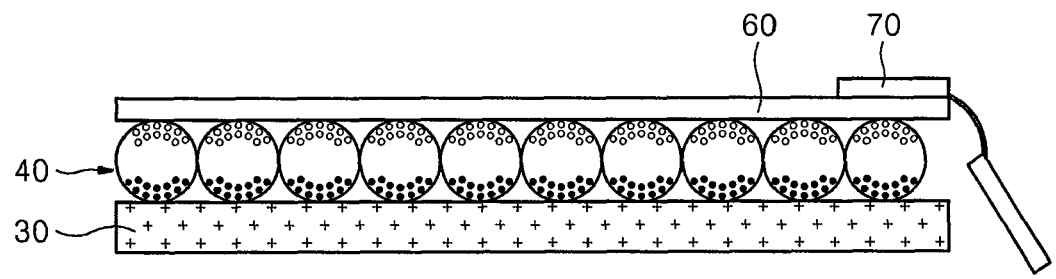

Referring to FIG. 2F and FIG. 2G, the carrier substrate 10 is detached from the flexible substrate 30 by using a laser beam or light. For example, since an excimer laser has energy that decomposes high molecules, a surface of a plastic substrate can be shaved by the excimer laser according to the amount of the laser irradiation and the amount of irradiation time that the laser beam is irradiated onto the surface of the plastic substrate. The adhesive layer 20 is decomposed by the irradiation of the laser beam or light, and the carrier substrate 10 is separated from the flexible substrate 30. The carrier substrate 10 may be detached from the flexible substrate 30 with a minimum energy density enough to transmit the laser beam or light.

FIG. 3 is a flow chart showing a process of fabricating a color electrophoretic display device as a flexible display device in accordance with a second exemplary embodiment of the present invention. FIGS. 4A, 4B, 4C, 4D, 4E, 4F, and 4G are cross-sectional views showing a process of fabricating a color electrophoretic display device as a flexible display device in accordance with the second exemplary embodiment of the present invention.

In a fabricating method of a color electrophoretic display device in accordance with the second exemplary embodiment of the present invention, an adhesive layer including transparent polyimide may be used to fabricate a color filter substrate, and an adhesive layer including transparent or opaque polyimide may be used to fabricate a TFT substrate.

Referring to FIG. 3, a fabricating method of a flexible display device in accordance with the second exemplary embodiment of the present invention includes preparing a TFT substrate (step S110), preparing a color filter substrate including applying an adhesive layer on a carrier substrate, placing a flexible substrate on the adhesive layer and forming a color filter array on the flexible substrate (step S120), separating the carrier substrate from the flexible substrate (step S130), and bonding the TFT substrate and the color filter substrate (step S140).

Hereinafter, a fabricating method of a color electrophoretic display device in accordance with the second exemplary embodiment of the present invention is described in detail with reference to FIGS. 4A to 4G Referring to FIG. 4A, a TFT substrate 230 including a TFT array is provided on a flexible substrate. The TFT substrate 230 may be produced by placing an adhesive layer on a carrier substrate, placing a flexible substrate on the adhesive layer, forming a TFT array on the flexible substrate, and separating the carrier substrate from the flexible substrate. The above processes are the same as the fabricating method of the electrophoretic display device of FIG. 2A to FIG. 2G. Therefore, a repetitive description is omitted.

Figure 4A:
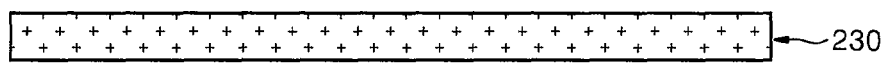
FIGS. 4A, 4B, 4C, 4D, 4E, 4F, and 4G are cross-sectional views showing a process of fabricating a color electrophoretic display device as a flexible display device in accordance with the second exemplary embodiment of the present invention.
Figure 4B:
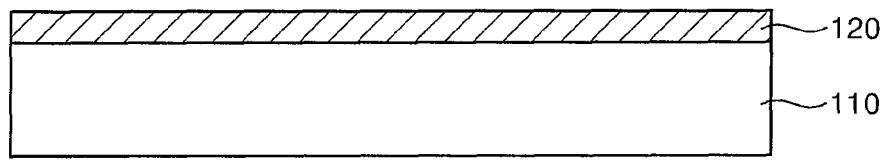
Figure 4C:
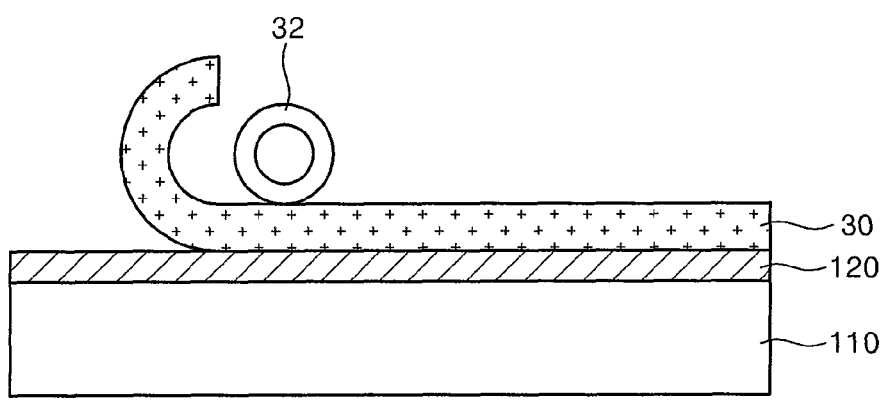
Figure 4D:
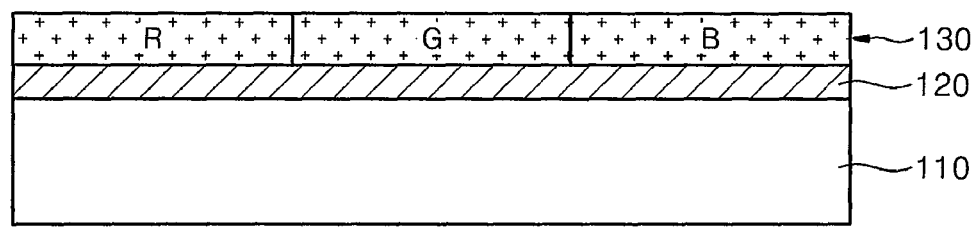

An adhesive layer 120 is applied on a carrier substrate 110 as shown in FIG. 4B. A flexible substrate 30 is placed on the adhesive layer 120 by using a roller 32 as shown in FIG. 4C. A color filter substrate 130 including a color filter array is formed as shown in FIG. 4D. The above processes are the same as the fabricating method of FIG. 4B to FIG. 4D except that the color filter array is formed on the flexible substrate 30 instead. Therefore, a repetitive description is omitted.

Figure 4E:
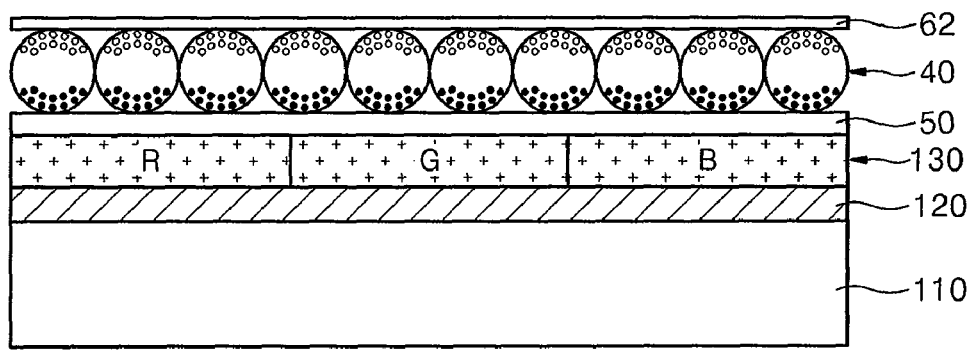

Referring to FIG. 4E, a transparent electrode 50, a display layer 40 and a protective film 62 are placed on the color filter substrate 130. The display layer 40 may include an electrophoretic film. Since a color electrophoretic display device includes the color filter array comprising red ("R"), green ("G"), and blue ("B") color filters, light passing through the respective filters is reflected by microcapsules of a white display state, thereby displaying colors.

Figure 4F:
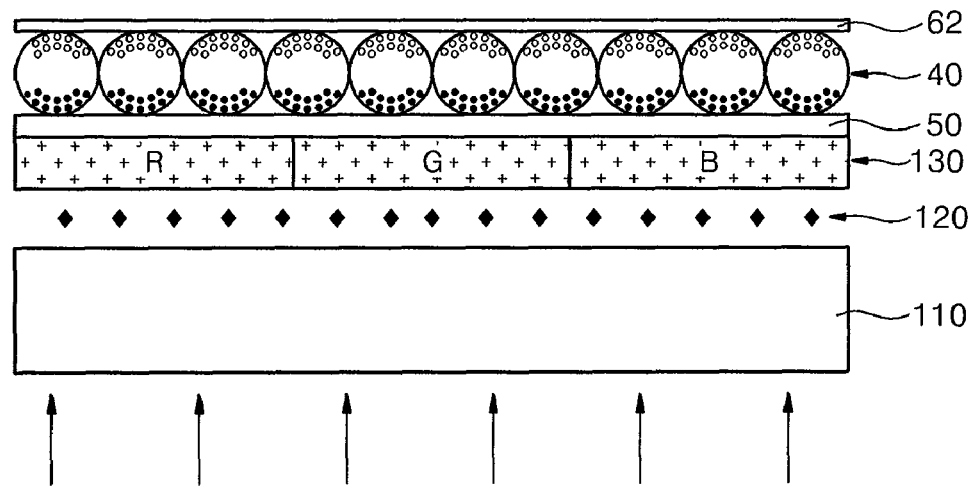

Referring to FIG. 4F, a color filter substrate of the color electrophoretic display device is formed by separating the carrier substrate 110 by using a laser beam or light.

Figure 4G:
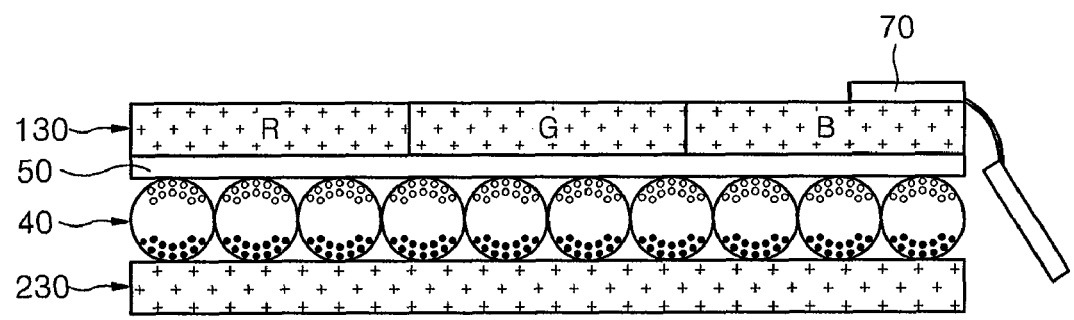

Referring to FIG. 4G, which is oriented inversely from the orientation of FIG. 4F, the color electrophoretic display device is obtained by bonding the TFT substrate 230 of FIG. 4A and the color filter substrate 130 of FIG. 4F and mounting a driving circuit on the display layer. During a bonding process, the protective film 62 formed on the electrophoretic film is removed.

As described above, the fabricating method of the flexible display device can be implemented at a high temperature and can easily detach a carrier substrate by the irradiation of a laser beam by using an adhesive hardening agent including polyimide in an adhesion layer between the carrier substrate and a plastic substrate.

In an exemplary embodiment of the present invention, although the TFT substrate has been described as being bonded to the color filter substrate after separating the carrier substrate 110 of the color filter substrate, it is possible to separate the carrier substrate 110 after combining the TFT substrate 230 with the color filter substrate and mounting the driving circuit.

Moreover, the flexible display device according to an exemplary embodiment of the present invention is applicable to various display devices in addition to the electrophoretic display device.

While the invention has been shown and described in connection with the exemplary embodiments, it will be apparent to those skilled in the art that modifications and variations can be made without departing from the spirit and scope of the invention as defined by the appended claims.

What is claimed is:

1. A method of fabricating a flexible display device, comprising:
    applying an adhesive layer including polyimide to a surface of a carrier substrate;
    placing a flexible substrate on the adhesive layer;
    forming a thin film transistor array on the flexible substrate; and
    separating the carrier substrate from the flexible substrate by irradiating a laser beam or light onto the adhesive layer.

2. The method according to claim 1, further comprising:
    forming a display layer on the flexible substrate on which the thin film transistor array is formed after forming a thin film transistor array on the flexible substrate;
    placing an opposite substrate on the display layer; and
    mounting a driving circuit on the display layer to drive the display layer.

3. The method according to claim 1, wherein the adhesive layer is comprised of a mixture of the polyimide and a coupler.

4. The method according to claim 1, wherein the adhesive layer comprises:
   a polyimide layer including the polyimide; and
   coupler layers which include a coupler and are formed at upper and lower surfaces of the polyimide layer.

5. The method according to claim 1, further comprising:
   heating the adhesive layer to a first temperature for a first amount of time after placing the adhesive layer on the surface of the carrier substrate; and
   heating the adhesive layer to a second temperature that is higher than the first temperature for a second amount of time after placing the flexible substrate on the adhesive layer.

6. The method according to claim 1, wherein a surface of the flexible substrate is processed by plasma or oxygen.

7. The method according to claim 1, wherein the flexible substrate is comprised of a polymer material selected from a group consisting of polyether sulphone, polyethylene naphthelate, fiber reinforced plastic, and polyacrylate.

8. The method according to claim 1, wherein separating the carrier substrate from the flexible substrate is implemented by irradiating an excimer laser beam onto the adhesive layer.

9. The method according to claim 1, wherein the polyimide has a glass transition temperature of 350° C. or greater.

10. The method according to claim 1, wherein placing the flexible substrate comprises laminating the flexible substrate on the adhesive layer.

11. The method according to claim 1, wherein the adhesive layer made of an adhesive hardening agent having a glass transition temperature of 350° C. or greater on a carrier substrate.

12. A method of fabricating a flexible display device, comprising:
   applying an adhesive layer including polyimide to a surface of a carrier substrate;
   placing a flexible substrate on the adhesive layer;
   forming a color filter array on the flexible substrate; and
   separating the carrier substrate from the flexible substrate by irradiating a laser beam or light onto the adhesive layer.

13. The method according to claim 12, further comprising:
   placing a display layer on the flexible substrate on which the color filter array is formed after forming a color filter array on the flexible substrate; and
   placing an opposite substrate on the display layer.

14. The method according to claim 12, wherein the adhesive layer is comprised of a mixture of the polyimide and a coupler.

15. The method according to claim 12, wherein the adhesive layer comprises:
   a polyimide layer including the polyimide; and
   coupler layers which include a coupler and are formed at upper and lower surfaces of the polyimide layer.

16. The method according to claim 12, further comprising:
   heating the adhesive layer to a first temperature for a first amount of time after placing the adhesive layer on the surface of the carrier substrate; and
   heating the adhesive layer to a second temperature that is higher than the first temperature for a second amount of time after placing the flexible substrate on the adhesive layer.

17. The method according to claim 12, wherein a surface of the flexible substrate is processed by plasma or oxygen.

18. The method according to claim 12, wherein the flexible substrate is comprised of a polymer material selected from a group consisting of, polyether sulphone, polyethylene naphthelate, fiber reinforced plastic, and polyacrylate.

19. The method according to claim 12, wherein separating the carrier substrate from the flexible substrate is implemented by irradiating an excimer laser beam onto the adhesive layer.

20. The method according to claim 12, wherein the polyimide has a glass transition temperature of 350° C. or greater.

21. The method according to claim 12, wherein placing the flexible substrate comprises laminating the flexible substrate on the adhesive layer.

* * * * *